United States Patent
Alber et al.

(10) Patent No.: US 12,105,158 B2
(45) Date of Patent: Oct. 1, 2024

(54) DEVICE AND SYSTEM FOR INDIRECTLY DETERMINING THE TEMPERATURE OF A POWER TRANSFORMER

(71) Applicant: MASCHINENFABRIK REINHAUSEN GMBH, Regensburg (DE)

(72) Inventors: Alexander Alber, Regensburg (DE); Tobias Gruber, Regenstauf (DE)

(73) Assignee: MASCHINENFABRIK REINHAUSEN GMBH, Regensburg (DE)

( * ) Notice: Subject to any disclaimer, the term of this patent is extended or adjusted under 35 U.S.C. 154(b) by 0 days.

(21) Appl. No.: 18/246,515

(22) PCT Filed: Sep. 3, 2021

(86) PCT No.: PCT/EP2021/074318
§ 371 (c)(1),
(2) Date: Mar. 24, 2023

(87) PCT Pub. No.: WO2022/069149
PCT Pub. Date: Apr. 7, 2022

(65) Prior Publication Data
US 2023/0305080 A1  Sep. 28, 2023

(30) Foreign Application Priority Data

Sep. 30, 2020 (DE) .................... 10 2020 125 533.0

(51) Int. Cl.
*G01R 31/62* (2020.01)
(52) U.S. Cl.
CPC .................. *G01R 31/62* (2020.01)
(58) Field of Classification Search
CPC ................................... G01R 31/62
See application file for complete search history.

(56) References Cited

U.S. PATENT DOCUMENTS

2016/0047765 A1* 2/2016 Feng ............... H01F 27/402
374/4
2016/0247065 A1* 8/2016 Nasle ............... G06N 20/00

FOREIGN PATENT DOCUMENTS

CN          106844972 A    6/2017
WO     WO 2015027127 A1   2/2015

OTHER PUBLICATIONS

Daniel J. Tylavsky, Qing He, Jennie Si, Gary A. McCulla, and James R. Hunt, "Transformer Top-Oil Temperature Modeling and Simulation" Sep. 2000, IEEE Transactions on Industry Applications, vol. 36, No. 5, pp. 1219-1225. (Year: 2000).*

(Continued)

*Primary Examiner* — Mohamed Charioui
*Assistant Examiner* — Christine Y Liao
(74) *Attorney, Agent, or Firm* — LEYDIG, VOIT & MAYER, LTD.

(57) ABSTRACT

A model of a power transformer describes a transfer behavior for input data into output data as a function of model parameters. In successive time windows, measurement dataset is received from first and second sensors of the power transformer. The model parameters are optimized by executing, for each of the time windows, the following group of steps a) to c), repeatedly: a) determining the output of the model using the input data defined by first sensor data, for the first execution of predefined parameters are used; b) determining a target value, which includes at least one squared error, weighted by a first weighting factor, the squared error is between the second sensor data from the measurement dataset assigned to the given time window and a previously determined output data, and c) determining optimization parameters as new model parameters based on the target value.

18 Claims, 3 Drawing Sheets

(56) References Cited

OTHER PUBLICATIONS

Dejan Susa and Hasse Nordman "Simple Model for Calculating Transformer Hot-Spot Temperature," Jul. 2009, IEEE Transactions on Power Delivery, vol. 24, No. 3, pp. 1257-1265. (Year: 2009).*

* cited by examiner

LEGEND
2 Device
4 Signal Interface
6 Processor Unit
8 Memory Unit
14 Ambient Temperature Sensor 16 Current Sensor
20, 28 Coil Packs
22 Winding Temperature Sensor 24 Oil Temperature Sensor
32 Detection Unit
34 Further Interface
38 Housing
40 Coolant

LEGEND
12 Group of Steps a)-c)
   a) Determine output data
   b) Determine target value
   c) Determine optimization parameters

FIG. 3

DEVICE AND SYSTEM FOR INDIRECTLY DETERMINING THE TEMPERATURE OF A POWER TRANSFORMER

CROSS REFERENCE TO RELATED APPLICATIONS

This application is a U.S. National Phase application under 35 U.S.C. § 371 of International Application No. PCT/EP2021/074318, filed on Sep. 3, 2021, and claims benefit to German Patent Application No. DE 10 2020 125 533.0, filed on Sep. 30, 2020. The International Application was published in German on Apr. 7, 2022 as WO 2022/069149 A1 under PCT Article 21(2).

FIELD

The present disclosure relates to a device and system for indirectly determining the temperature of a power transformer.

BACKGROUND

A power transformer is used to transform electrical power from an associated primary side to an associated secondary side. Power transformers are often designed to transform very high powers. For instance, a power transformer can transform at least 30 kW, at least 50 kW, or at least 100 kW. Transforming the electrical power produces heat, which is often dissipated to the surroundings via a cooling system of the power transformer. A power transformer has a primary side having a primary winding and a secondary side having a secondary winding. The power transformer has a housing, which forms a tank. Both windings are arranged in the tank of the power transformer, in which tank there is a coolant, in particular oil as the coolant, with said tank connected via a fluid-circuit to a cooler of the cooling system. The cooling capacity of the cooler often depends on the ambient temperature. If the ambient temperature is low, then a high temperature difference between the ambient temperature and the temperature at the cooler can contribute to a good cooling capacity of the primary and secondary sides. If the ambient temperature rises, the cooling capacity of the cooler can fall. In order to prevent the coolant from overheating, power transformers are often equipped with sensors for detecting by means of sensors the temperature at least at one point of the power transformer.

Mathematical models suitable for modeling a power transformer are also known. These models have the disadvantage, however, that a large number of parameters of the models must be predefined in order that the models guarantee a robust description of the actual power transformer. The parameters of the models must often be determined on the basis of the actual properties of the power transformer. It has been found in practice that the amount of effort needed to determine such parameters for the models is not inconsiderable. These models are therefore used only very rarely in practice for modeling properties of a power transformer.

SUMMARY

In an embodiment, the present disclosure provides a device that includes a signal interface; a processor unit; and a memory unit. The signal interface is designed to receive a measurement signal representing first sensor data and second sensor data. The first sensor data and the second sensor data, in each case, represent at least one quantity detected in or at a power transformer by sensors. The processor unit is configured to produce, in each of successive time windows, a measurement dataset from the first sensor data and the second sensor data received in a given time window. In the memory unit, a simulation model of the power transformer is stored, the simulation model describing a transfer behavior for input data into output data as a function of model parameters of the simulation model. The processor unit is configured to execute, for each of the time windows, the following group of steps a) to c), repeatedly as a group:
  a) determining the output data by executing the simulation model using the input data, which is defined by the first sensor data from the measurement dataset assigned to the given time window, and using the model parameters, which, for a first execution of the simulation model for the given time window, are defined by predefined reference parameters, and otherwise by most recently determined optimization parameters,
  b) determining a target value, which includes at least one squared error, weighted by a first weighting factor, the squared error is between the second sensor data from the measurement dataset assigned to the given time window and a previously determined output data, and
  c) determining optimization parameters as new model parameters for the simulation model on the basis of the at least one target value determined in the given time window.

The simulation model also describes a model value for a temperature inside the power transformer as a function of the input data and the model parameters. The processor unit is configured to determine, for each time window, the model value by executing the simulation model using the input data, which is defined by the first sensor data from the measurement dataset assigned to the given time window, and using the model parameters, which for the given time window, are defined by the most recently determined optimization parameters.

BRIEF DESCRIPTION OF THE DRAWINGS

Subject matter of the present disclosure will be described in even greater detail below based on the exemplary figures. All features described and/or illustrated herein can be used alone or combined in different combinations. The features and advantages of various embodiments will become apparent by reading the following detailed description with reference to the attached drawings, which illustrate the following.

DETAILED DESCRIPTION

Aspects of the present disclosure provide a device and/or a system having such a device, by means of which device it is possible to infer reliably and as simply as possible a relevant temperature of the power transformer.

According to a first aspect of the present disclosure, a device is provided that has a signal interface, a processor unit and a memory unit. The signal interface is designed to receive a measurement signal representing first sensor data and second sensor data, wherein the first sensor data and second sensor data in each case represent at least one quantity detected in or at a power transformer by means of sensors. The processor unit is configured to produce in each of successive time windows a measurement dataset from the first and second sensor data received in the given time window. In the memory unit is stored a simulation model of the power transformer, which simulation model describes a transfer behavior for input data into output data as a function of model parameters of the simulation model. The processor unit is configured to execute for each time window the following group of steps a) to c) repeatedly as a group: a) determining output data by executing the simulation model using input data, which is defined by first sensor data from the measurement dataset assigned to the given time window, and using model parameters, which, for the first execution of the simulation model for the given time window are defined by predefined reference parameters, and otherwise by the most recently determined optimization parameters, b) determining a target value, which comprises at least one squared error, weighted by a first weighting factor, which error is between the second sensor data from the measurement dataset assigned to the given time window and the previously determined output data, and c) determining optimization parameters as new model parameters for the simulation model on the basis of the at least one target value determined in the given time window. The simulation model also describes a model value for a temperature inside the power transformer as a function of input data and model parameters. The processor unit is configured to determine for each time window the model value by executing the simulation model using input data, which is defined by first sensor data from the measurement dataset assigned to the given time window, and using model parameters, which for the given time window are defined by the most recently determined optimization parameters.

Before entering into details of the features of the device according to the first aspect, it must be emphasized that the device, and in particular the processor unit of the device, can be used to improve the model parameters for the simulation model from time window to time window, so that by means of the simulation model, a model value can be determined for a temperature inside the power transformer, which was not previously detected on or in the power transformer by means of sensors. The thermal state of the power transformer can thereby be monitored particularly reliably. The repeated optimization of the model parameters of the simulation model also allows the device to be put into operation particularly easily. This is because, although the model parameters used for the first execution of the simulation model should be a good estimate of the model parameters, they need not necessarily be optimal. Therefore they can be defined by predefined reference parameters at the start. Since the model parameters for the simulation model are improved after a plurality of time windows, the processor unit can determine at least one temperature by means of the simulation model inside the power transformer, and this determined temperature can be used for monitoring the power transformer. This allows better utilization of the performance capacity of the transformer, indeed up to the thermal performance limit.

Features of the device shall be presented in greater detail below.

The device has the signal interface, the processor unit and the memory unit. The signal interface can be a wired signal interface or a wireless signal interface. The signal interface is designed to receive the measurement signal representing the first sensor data and the second sensor data. The device can have a further signal interface, which is designed to send an output signal representing the model value determined by the processor unit for the temperature. It is fundamentally possible that the signal interface for receiving the measurement signal and the further signal interface for sending the output signal are formed by a shared signal interface. They can also be separate signal interfaces, however.

The first sensor data and the second sensor data in each case represent at least one quantity detected in or at the power transformer by means of sensors. Said quantity is preferably a quantity detected by a sensor. The respective quantities detected by means of sensors preferably relate to a mechanical, electrical or other physical quantity. The first sensor data preferably represents exogenous quantities of the power transformer that can be detected by means of sensors. The second sensor data preferably represents quantities of the power transformer that can be detected by means of sensors but which are not exogenous. Thus, the first sensor data can represent quantities of the power transformer that can be detected by means of sensors and that act on the power transformer from the outside and/or act on the power transformer in a way that cannot be influenced. These can be, for example, the voltage applied to the terminals of the primary side of the power transformer, the current flowing through the primary-side windings, or the ambient temperature of the power transformer. The exogenous quantities of the power transformer influence non-exogenous quantities of the power transformer such as the temperature of the coolant inside the tank of the power transformer. The quantities represented by the second sensor data are thus preferably quantities of the power transformer that are brought about by the quantities represented by the first sensor data.

The quantities of the power transformer that are represented by the first and second sensor data are preferably sampled at a predefined frequency, so that the measurement signal preferably represents a continuous data stream of sample values in the form of the first sensor data and second sensor data. The processor unit is therefore configured to produce in each of successive time windows a measurement dataset from the first and second sensor data received in the given time window. Hence, if a continuous data stream of the first and second sensor data is fed by means of the measurement signal to the processor unit via the signal interface, the processor unit will copy from this data stream, over a given time window, first and second sensor data from the data stream in order to produce a measurement dataset assigned to the given time window. The time windows can partially overlap in time. For example, if a time window has a time length of 24 hours, and if the processor unit produces every four hours for a new time window of the past 24 hours a measurement dataset associated with that time window, then the successive time windows overlap at least partially, as accordingly do the measurement datasets as well. In the previous example, a most recently specified time window and a previously specified time window can overlap over a time period of sixteen hours. Each time window can overlap a plurality of preceding time windows. If the time windows overlap, it is preferred that data is copied from the data stream in order to produce the measurement dataset associated with the particular time window. The processor unit can be configured accordingly for this purpose. It is fundamentally also possible, however, that the time windows succeed one another directly and without overlapping. Thus the time windows can be specified without any overlap. It is also possible, however, that a defined or arbitrary time break is provided between each of the time windows, in which time break none of the data received via the measurement signal is used to produce the measurement dataset. Each time window preferably has a predefined constant size in time. If a multiplicity of measurement datasets are produced for the respective associated time windows, it can also be said that the time windows move forwards in time in discrete predetermined intervals, and the processor unit produces for each time window an associated measurement dataset. As already explained above, it is preferred that the length of each time window equals 24 hours, for example. In addition, the time window can be moved forwards every four hours by four hours each time. It is not actually the same time window involved, however, but a new time window of the same size is specified.

In the memory unit of the device is stored a simulation model. The simulation model is preferably a mathematical model of the power transformer, which simulation model can be executed by the processor unit and describes a transfer behavior for input data into output data as a function of model parameters of the simulation model. The input data can be formed by data representing exogenous quantities of the power transformer that can be detected by means of sensors. The output data can be formed by data representing quantities of the power transformer that cannot be detected by means of sensors and/or representing non-exogenous quantities of the power transformer. The simulation model preferably also describes a transfer behavior for input data into the model value as a function of model parameters of the simulation model.

The simulation model has the advantage that the simulation model can be used by the processor unit to estimate at least one or more states of the power transformer. A state of the power transformer can be, for example, a temperature prevailing inside the power transformer, or other physical quantities of the power transformer that depend on exogenous quantities of the power transformer. The output data, which can be generated in a simulation by the simulation model, therefore often relates to the same or similar transformer properties as the second sensor data, which is represented by the measurement signal and reaches the processor unit via the measurement signal. The output data, which is generated in the simulation by the simulation model, should be understood here, however, as estimated values for the transformer properties, whereas the second sensor data, which is detected by means of sensors, should be understood preferably as actual values for the corresponding transformer properties. In other words, the output data can represent estimated values for the transformer properties, and the second sensor data can represent actual values, detected by means of sensors, for the same sensor properties. A comparison between the estimated values and actual values is therefore possible by means of the output data and the second sensor data, where the result of the comparison represents an error of the estimated values with respect to the actual values, or vice versa. If the error is small, then it can be assumed that the simulation model is describing the power transformer particularly well. To achieve a reduction in the error, the above-mentioned group (steps a), b) and c)) is preferably executed for each time window repeatedly as a group in order to reach an optimization of the model parameters of the simulation model. The aim here is to minimize the weighted squared error between the second sensor data from the measurement dataset assigned to the given time window and the output data, which has been produced by the simulation during execution of step a) in the associated group of steps a) to c). The processor unit can thereby determine in each step c) optimization parameters as new model parameters for the simulation model, so that, after repeated execution of the group of steps a) to c), the model parameters are improved to such an extent that the weighted squared error is often reduced to a minimum. The group of steps a) to c) is preferably repeated for at least 100 time windows. The group of steps a) to c) is repeatedly executed for each time window. Thus the stated repetition as a group takes place.

The simulation model is also designed to produce during execution of the simulation model, a model value for a temperature inside the power transformer as a function of the input data and the model parameters, in particular of the model parameters most recently updated by the respective optimization parameters. The model value preferably represents a temperature at a predefined point inside the power transformer. This point can be any predefined point inside the power transformer. For instance the temperature can refer to the hot-spot temperature at one of the windings of the primary side or secondary side. The model value can also refer to what is known as a top-oil temperature, however. This is the case in particular when the coolant is formed by oil in the tank of the power transformer. The top-oil temperature is preferably in the top region of the tank.

In order to achieve an update as accurate as possible of the model value, the processor unit determines the model value for each time window by executing the simulation model. The simulation model is executed using input data, which is defined by first sensor data from the measurement dataset assigned to the given time window, and using model parameters, which for the given time window are defined by the most recently determined optimization parameters. The processor unit can be configured accordingly for this purpose. Therefore for each time window, the processor unit can determine a model value for one of the aforementioned temperatures inside the power transformer. This temperature can then be represented by an output signal, which can be transferred, in particular sent, through the, or a further, signal interface of the device. The information about the aforementioned temperature inside the power transformer is therefore available to the recipient at a sufficient update rate.

In step b), which can be executed by the processor unit, a target value is determined. The target value can be formed from the sum of a plurality of components. It is provided, however, that the target value comprises as one component, or even is formed solely by, the following weighted squared error. For instance, the target value comprises, or is formed solely by, the squared error, weighted by the first weighting factor, which error is between the second sensor data from the measurement dataset assigned to the given time window and the previously determined output data. The simple (not squared) error can be formed, for example, by the difference between the second sensor data and the output data. The processor unit is preferably designed to determine this error. The second sensor data and the output data can be interpreted in each case as a data vector, where the simple error can be formed from the difference in the two vectors. The squared error can in turn be formed from the sum of the squared entries of the simple error. The processor unit can be designed for this purpose. The squared error is therefore preferably a one-dimensional quantity.

The processor unit is preferably configured to execute a predefined optimization method in order to determine the optimization parameters in step c). For instance, the processor unit can be configured to repeat the group, which comprises the steps a) to c), a number of times until in step b) a target value is reached that is less than a predefined limit value and/or in step b) or c) a predefined break criterion is fulfilled. For example, it is possible that the processor unit is configured to execute for steps a) to c) what is known as an SQP (sequential quadratic programming) optimization method or an active-set method in order to solve the SQP problem. For instance, the processor unit can be configured to determine in step c) the optimization parameters according to the most recently determined target value in step b), or according to a plurality of target values from a plurality of earlier steps b). If a plurality of target values from preceding steps b) are included, it is preferred that these steps have been executed for the same time window. In step c), the processor unit can thus determine optimization parameters according to one or more target values, in order that a smaller target value is determined when step b) is executed again. This sequence for the optimization can be repeated multiple times until in step b) is determined a particularly small target value, and in step c) are determined optimization parameters or new model parameters for the new simulation model, so that a particularly good and exact description of the power transformer is possible by means of the simulation model.

An advantageous embodiment of the device is characterized in that the temperature of the power transformer, which temperature is described by the model value, comprises, or is, a hot-spot temperature or a top-oil temperature or a bottom-oil temperature of the power transformer. The hot-spot temperature, the top-oil temperature and the bottom-oil temperature are often particularly interesting and relevant temperatures for the operation of a power transformer. These temperatures are not always detected by means of sensors. The simulation model therefore offers the possibility for the processor unit to determine the model value by means of the simulation model, which model value describes and thereby represents at least one of said temperatures or a plurality of said temperatures of the power transformer. Therefore the simulation model can be used to determine a multiplicity of temperatures and/or the particularly relevant temperatures, which are not, and/or need not be, necessarily detected by means of a sensor.

A further advantageous embodiment of the device is characterized in that the temperature in the power transformer, which temperature can be described by the model value, refers to a temperature in a region at the top layer of the oil in the power transformer or to a temperature at a point on one of the windings of the power transformer. A large amount of effort is required in particular to detect a temperature directly at a winding of the power transformer by means of sensors. This effort can be reduced by using the simulation model. This is because the second sensor data and the output data can be used for optimizing the model parameters of the simulation model, where the second sensor data represents quantities of the power transformer that are detected by means of sensors. These quantities represented by the second sensor data can be, for example, quantities of the power transformer that can be detected easily or with little effort by means of sensors. It is therefore possible to use less effort to determine a temperature at a predefined point in the power transformer.

In addition, it can be advantageously provided that at least one further model value is provided, each of which describes a further physical quantity of the power transformer as a function of input data and model parameters. The processor unit can also be configured to determine for each time window each of the model values by executing the simulation model using input data and model parameters. A further model value can describe, for example, a current, a voltage, a mechanical force or other physical quantity of the power transformer. When the model value for the temperature inside the power transformer is referred to below, then it is preferably provided that the associated, preferred explanations, advantageous features, technical effects and advantages can apply analogously to each further model value.

A further advantageous embodiment of the device is characterized in that the number of repetitions as a group of the group of steps a) to c) is between 10 and 1000. Said repetition as a group refers to the repetition of the entire group containing steps a) to c). The group of steps a) to c) is thus executed each time, in order for the repetition to begin subsequently, namely to begin again with step a) to c). Thus the group of steps is repeated as a group. The minimum number of ten repetitions, and limiting the number to 1000 repetitions, sets an advantageous range for the number of repetitions, for which it has been found in practice that model parameters can thereby be determined for the simulation model such that the simulation model and the associated model parameters can describe the power transformer particularly well.

A further advantageous embodiment of the device is characterized in that the device is configured to determine the target value in step b), for the execution for the second time window onwards, in each case in such a way that the target value additionally comprises a squared difference, weighted by a second weighting factor, which difference is between the most recently determined model parameters and the optimization parameters determined last for the preceding time window. As already explained at the outset, the processor unit is configured to produce in each of successive time windows a measurement dataset from the first and second sensor data received in the given time window. The second time window is thus the second time window in the series of time windows. For each time window, the processor unit of the device executes the group containing the steps a), b) and c) repeatedly multiple times in succession, where within each group, the step b) follows step a), and step c) follows step b). In each step c), the processor unit determines optimization parameters as new model parameters for the simulation model.

For each time window, because of the repetition of the group, step c) is likewise executed repeatedly. Therefore there is also a final execution of step c), so that for the given time window, when step c) is executed for the last time, the most recently defined optimization parameters are also specified as new model parameters for the simulation model and specified with reference to the given signal window.

In step b) of the group step a) to c), a target value is determined, which, according to the first aspect of the present disclosure, comprises at least one squared error, weighted by a first weighting factor, which error is between the second sensor data from the measurement dataset assigned to the given time window and the previously determined output data. According to the last-mentioned advantageous embodiment of the device, the target value preferably additionally comprises a squared difference, weighted by a second weighting factor, which difference is between the most recently defined model parameters and the optimization parameters determined last for the preceding time window. On repetition of the group of steps a) to c), and for the second target window onwards, in each case a target value is thus determined that is formed from at least two components, namely the weighted squared error and the weighted squared difference. The first and second weighting factors specify which of the two components defines the target value to the greater extent. It has proven to be advantageous if the second weighting factor is greater than the first weighting factor. In this case, the target value is influenced more strongly by the squared difference. A larger second weighting factor prevents a rapid change in the model parameters. This is because the squared difference is based in the first instance on the simple difference between the most recently defined model parameters and the optimization parameters determined last for the preceding time window. To determine the target value in step b) in the execution for the second time window, for example, the processor unit can ascertain first the simple difference between the most recently defined model parameters and the optimization parameters determined last for the first time window. The model parameters and the optimization parameters can be regarded in each case as a vector, and thus the simple difference between the model parameters and the optimization parameters can likewise be interpreted as a vector. The squared difference is in this case the sum of the squared entries of the simple difference interpreted as a vector. The squared difference is hence a one-dimensional value. The processor unit can be configured to determine the simple and/or squared difference. The target value can be ascertained from the sum of the error, weighted by the first weighting factor, and the squared difference, weighted by the second weighting factor. The processor unit can preferably be designed to determine the target value accordingly.

A further advantageous embodiment of the device is characterized in that the device is configured to determine the target value in step b) in such a way that the target value additionally comprises a squared difference, weighted by a third weighting factor, which difference is between the most recently defined model parameters and reference parameters. For example, the target value can hence be formed from the sum of three components. The first component can be formed by the squared error, weighted by the first weighting factor, the second component by the squared difference, weighted by the second weighting factor, and the third component by the squared difference, weighted by the third weighting factor. The squared difference, weighted by the second weighting factor, differs from the squared difference, weighted by the third weighting factor. The squared difference associated with the second weighting factor relates to the squared difference that was explained for the earlier advantageous exemplary embodiment. The squared difference weighted by the direct weighting factor relates to the squared difference between the most recently defined model parameters and reference parameters. For ascertaining the difference, reference is made analogously to the advantageous explanations, preferred features and effects as were explained in connection with the previous difference.

The reference parameters can be predefined. For example, they can be predefined as initial values for the model parameters. These initial values can be predefined by a user of the device and/or be stored in the memory unit of the device. The dimension of the reference parameters is preferably the same as the dimension of the model parameters. If the model parameters and the reference parameters are interpreted in each case as a vector, then the simple difference between the model parameters and the reference parameters can likewise result in a vector. The simple difference between the most recently defined model parameters and the reference parameters can therefore be a vector composed of difference quantities. The squared difference of the simple difference is preferably the sum of the squared entries of the simple difference or associated vector. The processor unit is preferably configured to determine the simple and/or squared difference. The third weighting factor is often chosen to be small in relation to the first and second weighting factors, and thereby results in weak weighting. The positive effect thereof in the optimization of the model parameters is that model parameters are adapted preferably only as far as is advantageous to the target value. Slow divergences, which can also be called drift, caused by irrelevant or redundant model parameters, can be avoided by means of the third weighting factor.

A further advantageous embodiment of the device is characterized in that the first sensor data represents quantities acting on the power transformer from the outside and detected by means of sensors. For example, one of these quantities is the ambient temperature acting on the power transformer from the outside. The ambient temperature can thus be represented by the first sensor data. The ambient temperature has an influence on the properties inside the transformer. For instance, the temperature of the coolant, in particular oil, inside the transformer can be influenced by the external temperature. The temperature of the coolant in the power transformer can also depend on the power of the solar radiation acting on the power transformer from the outside. A corresponding solar radiation power can therefore be represented by the first sensor data as a quantity acting on the power transformer from the outside and detectable by means of sensors. The ambient temperature and the solar radiation power are each quantities that are not influenced by the state of the power transformer. Other quantities acting on the power transformer from the outside are, for example, an electric current, a voltage, or an electrical power on the primary side or on the secondary side of the power transformer. All of the aforementioned quantities act on the power transformer from the outside and bring about a change in physical quantities inside the power transformer. The first sensor data preferably represents solely the quantities acting on the power transformer from the outside and detected by means of sensors. If the model parameters are chosen such that the simulation model correctly describes the behavior of the power transformer, the first sensor data can be used as input data to produce new output data which represents physical quantities inside the power transformer and, if applicable, are not detected by means of sensors or cannot be detected by means of sensors, at least not with reasonable effort.

A further advantageous embodiment of the device is characterized in that the first sensor data represents at least two quantities from the following group of quantities: electric current on the primary side of the power transformer, electric current on the secondary side of the power transformer, electrical power on the primary side of the power transformer, electrical power on the secondary side of the power transformer, ambient temperature outside the power transformer, solar radiation power outside the power transformer, and wind speed outside the power transformer. The aforementioned group of possible physical quantities that act on the power transformer from the outside and can be detected by means of sensors can be a closed or open group. For instance, it is possible that the sensor data represents solely at least two quantities of said group. The quantities of the aforementioned group preferably have in common that they act on the power transformer from the outside and thereby bring about a change in physical quantities inside the power transformer.

A further advantageous embodiment of the device is characterized in that the second sensor data represents quantities detected inside the power transformer. The detected quantities preferably relate to physical quantities of constituent parts of the power transformer that are arranged inside the power transformer, in particular inside the housing of the power transformer. For example, they can be physical quantities of the coolant, in particular oil, physical quantities of the windings on the primary and/or secondary side, and/or mechanical quantities which arise through mechanical interaction between component parts inside the power transformer. The quantities represented by the second sensor data are therefore preferably a consequence of the effect of the quantities represented by the first sensor data on the power transformer, and of the system behavior of the power transformer as such. For example, if the external temperature is represented by the first sensor data, then the external temperature can affect the power transformer, and the system behavior of the power transformer can lead to a change in the temperature of the oil, for instance which forms the coolant. The oil temperature can thus be represented by the second sensor data, because this is a resultant quantity arising inside the power transformer. The quantities represented by the second sensor data can be detected by means of sensors. This also applies to the aforementioned example in which the oil temperature is represented by the second sensor data.

A further advantageous embodiment of the device is characterized in that the second sensor data represents at least one quantity from the following group of quantities: oil temperature, oil temperature at the top of the power transformer, oil temperature at the bottom of the power transformer, winding temperature at primary-side windings, winding temperature at secondary-side windings, heat flow from primary-side windings of the power transformer into the oil of the power transformer, heat flow from secondary-side windings of the power transformer into the oil of the power transformer, and oil viscosity of the oil of the power transformer. The aforementioned group of possible physical quantities can be a closed or open group. For instance, it is possible that the second sensor data represents solely at least two quantities of said group. The second sensor data preferably represents, however, solely at least one quantity of the aforementioned group of quantities. The quantities of the aforementioned group preferably have in common that they are influenced by the quantities represented by the first sensor data and are influenced by the system behavior of the power transformer.

For the quantities represented by the first and second sensor data, it applies in each case that the device, or a system containing the device, can have, for each represented quantity detected by means of sensors, an associated sensor suitable for each. For the temperature measurement, the device or the system can have one or more sensors, for example. For the voltage, the device or the system can have a corresponding sensor for detecting a voltage. The same applies to the further quantities that are actually represented by the first and second sensor data. Two or more sensors can be integrated with each other. For instance, a suitably integrated sensor can be designed to detect an electric current, a voltage and an electrical power.

A further advantageous embodiment of the device is characterized in that the first and second sensor data from a measurement dataset represent in each case the associated quantities resulting from sample values of the quantities detected at periodic intervals by means of sensors. The sample values preferably form the values of the quantities that have occurred during a time span corresponding to the time window. The first and second sensor data from a measurement dataset therefore represent in each case quantities from the same time span, which corresponds to the given time window.

A further advantageous embodiment of the device is characterized in that the device is configured so that in each time window, an associated measurement dataset is produced from first and second sensor data that represent the associated quantities over a predefined time span. The length of each predefined time span is preferably the same for each measurement dataset and thus for each time window. Each time window is preferably of equal length in time. For instance, each time window can have a length of 24 hours.

A further advantageous embodiment of the device is characterized in that the predefined time span is greater than the largest time constant of the power transformer. The predefined time span preferably equals at least twice, in particular at least ten times, the longest time constant of the power transformer. This has the advantage that the adaptation of the model parameters, in particular by the repetition of steps a) to c) as a group, takes place only slowly compared with the power transformer dynamics defined by the time constant. This in turn allows optimization of the model parameters that is robust to disturbances.

A further advantageous embodiment of the device is characterized in that the predefined time span equals at least two hours, at least four hours, at least eight hours, at least sixteen hours, at least twenty-four hours, or at least two days. It has been found in practice that the predefined time span for each time window should not be chosen to be too short so as to ensure the model parameters are adapted only slowly. Too large a time span, however, could result in the model parameters being adapted at too low a rate. The predefined time span is therefore preferably at least two, four, eight or at least twenty-four hours. It is also preferred however, that the predefined time span is less than ten days, preferably less than five days and preferably less than four days.

A further advantageous embodiment of the device is characterized in that the simulation model is based on an IEEE Annex G model for the power transformer. This model appears in the publication entitled "IEEE Guide for Loading Mineral-Oil-Immersed Transformers and Step-Voltage-Regulators", which is available via the website www.ieee.org.

A further advantageous embodiment of the device is characterized in that the simulation model is based on an IEC model for the power transformer. The IEC model is issued by the International Electrotechnical Commission (www.iec.ch) and is preferably based on the IEC 60076-7 standard. "Edition 2.0 2018-01" entitled "Loading guide for mineral-oil-immersed power transformers" or "Power transformers—Part 7: Loading guide for mineral-oil-immersed power transformers" has proven to be an advantageous version.

A further advantageous embodiment of the device is characterized in that the device is designed to transfer by means of the signal interface or another interface, an output signal representing the model value. The processor unit can preferably be configured to produce the output signal. The model value can be provided to a higher-level unit and/or a higher-level device by means of the output signal. The output signal can be sent to the relevant unit or device by means of the signal interface or the other signal interface. The higher-level device can be, for example, a control center for a plurality of power transformers and devices according to the first aspect of the present disclosure.

A further advantageous embodiment of the device is characterized in that the processor unit is configured to define the optimization parameters last determined for a time window as final parameters for the given time window, to determine trend parameters by an approximation using the plurality of final parameters, to compare the trend parameters with associated predefined limit values, and, in the event that one of the limit values is exceeded, to define a first warning state for the power transformer. The group of steps a) to c) is repeated multiple times for each time window. In the last execution of step c) of the repetitions, optimization parameters are determined that are defined as the final parameters for the given time window. The processor unit is configured accordingly for this purpose. Since the processor unit is also configured to produce a plurality of time windows in succession, each having associated measurement data, a corresponding multiplicity of final parameters are also determined as a result of the multiplicity of time windows. The processor unit is configured to perform an approximation on the basis of this plurality of final parameters and thereby determine trend parameters. For example, these trend parameters can represent the final parameters for future time windows. They can also represent, however, a deviation from the last final parameter or from a mean value of the final parameters with respect to the final parameter approximated in the future. In addition, the processor unit is configured to compare the trend parameters determined by approximation with associated predefined limit values. The trend parameters preferably have the same dimension as the optimization parameters. The trend parameters can thus form a vector, where the limit values comprise for each entry of the vector a corresponding limit value. Thus each of the trend parameters can be compared with an associated predefined limit value. The processor unit is preferably configured accordingly for this purpose. The trend parameters and the comparison with the limit values offer the possibility of defining a warning state if one of the trend parameters or a plurality of the trend parameters exceed the associated limit value(s). The processor unit is therefore configured to define a first warning state for the power transformer in the event that one of the limit values or a plurality of the limit values is exceeded. This first warning state can indicate that the power transformer will be in a problematic or critical state in the future. It can therefore be recognized from the trend parameters whether the simulation model, and hence also the actual system behavior, of the power transformer could in future change into a problematic or critical state.

According to a second aspect of the present disclosure, a system is provided. The system has a plurality of devices. Each of the devices is designed according to the first aspect of the present disclosure and/or one of the associated advantageous embodiments. For each of the devices of the system, reference is therefore made analogously to the advantageous explanations, preferred features, technical effects and/or advantages as have already been explained for the first aspect of the present disclosure or one of the associated advantageous embodiments.

The system according to the second aspect of the present disclosure is designed to compare with each other the model parameters defined by each of the devices, and thereby ascertain model-parameter differences in each case. The system is also designed to compare each of the model difference parameters with associated predefined limit values, and in the event that one of the limit values is exceeded, to identify the model parameters causing said exceeding, and the associated power transformer, and to define for the identified power transformer a second warning state.

The system preferably also has a plurality of power transformers. Each power transformer is assigned one of the aforementioned devices of the system, and therefore each device assigned to a power transformer is designed to receive, via a measurement signal, first and second sensor data, which in each case represent a quantity detected in or at the assigned power transformer by means of sensors. It is also preferred that the power transformers are of the same type and/or of the same design. This makes it possible to be able to compare the system behavior of the power transformers with each other. The simulation models of the devices are adjusted in such a way by the respectively associated model parameters that they can simulate the system behavior of the respectively assigned power transformers. The comparison of the model parameters of the plurality of devices can therefore lead to a similar result as comparing the system behavior of the plurality of power transformers of the system. It can therefore be recognized from the model-parameter differences whether the system behavior of the power transformers differs widely. If one of the power transformers has a widely deviating system behavior, in particular a system behavior that deviates widely from a mean value of the other power transformers, then the model parameters of the simulation model for this deviating power transformer likewise deviate from the other model parameters of the other devices by larger model-parameter differences. If model-parameter differences exceed associated predefined limit values, this is an indicator that the model parameters causing said exceeding belong to a simulation model of a device that is receiving a measurement signal from a power transformer that is in a problematic or critical state. Therefore it is possible to identify by means of the model parameters a power transformer for which a second warning state must be defined. The processor unit is therefore preferably configured to ascertain for a simulation model the model parameters that are causing associated limit values to be exceeded, and to identify on the basis of the model parameters and the associated simulation model, the associated device and the associated power transformer from which the identified device is receiving the measurement signal representing the first and second sensor data, which in turn in each case represent quantities of the identified power transformer that are detected by means of sensors. The system is preferably also designed to define a second warning state for this identified power transformer. If the second warning state is defined, then follow-up actions can be taken to check the identified power transformer and, if applicable, initiate repair measures.

Further features, advantages and possible applications of the present disclosure can be found in the following description of the exemplary embodiments and in the figures. All the features described and/or depicted therein form individually or in combination the subject matter of the present disclosure irrespective of how they are combined in the claims or the dependency references thereof. In the figures, the same reference signs continue to stand for the same or similar objects.

Figure 1:
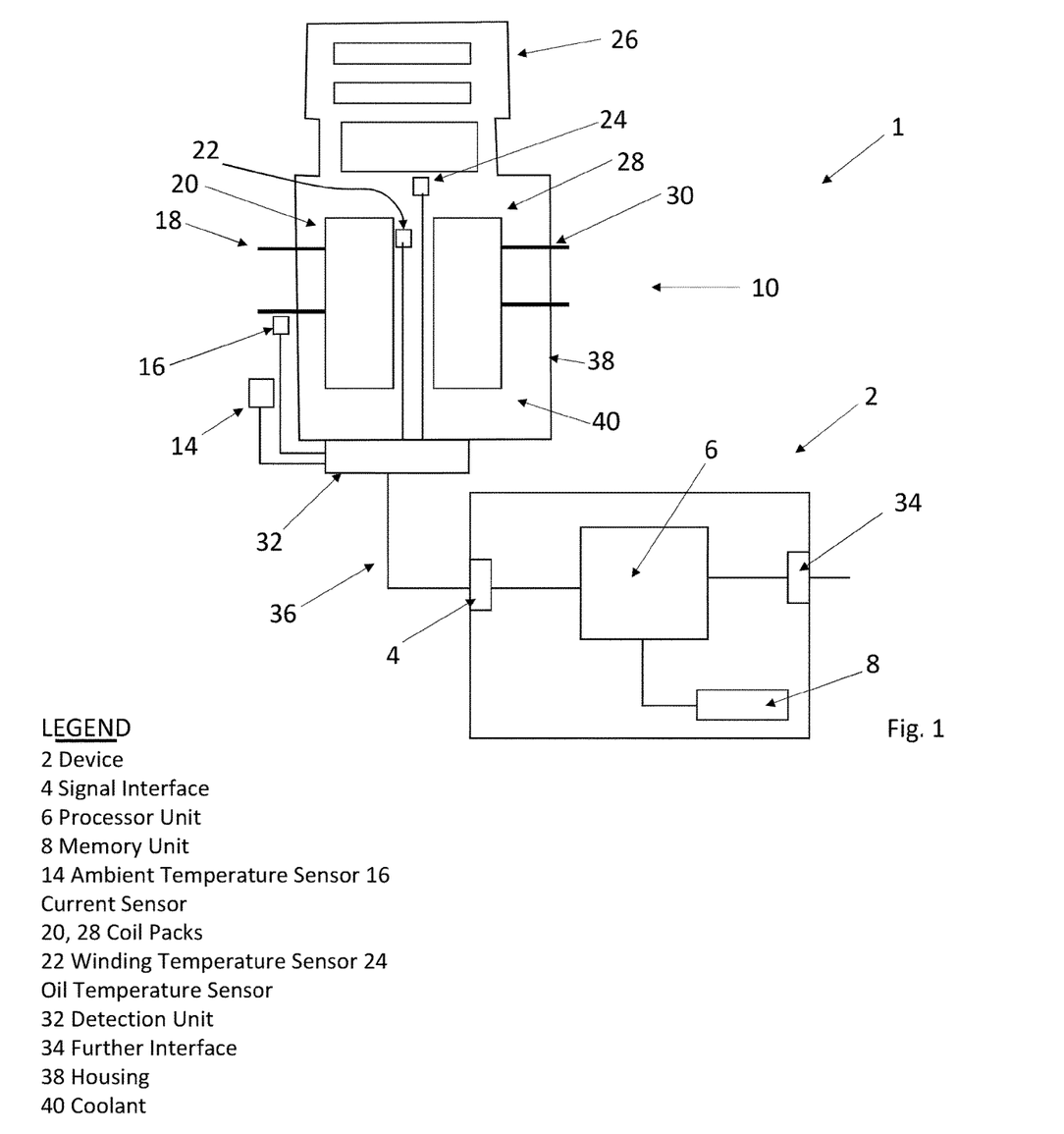
FIG. 1 shows in a schematic diagram an advantageous embodiment of a system having a power transformer, and an advantageous embodiment of a device.

FIG. 1 shows an advantageous embodiment of a system 1. The system 1 comprises a power transformer 10 and a device 2.

When advantageous features, technical effect and/or advantages of the device 2 are explained below, then these explanations can also apply to an embodiment of the device 2 that is not part of the system 1, and/or can apply to a device 2 that does form part of the system 1. The power transformer 10 can form a further part of the system 1.

The power transformer 10 of the system 1 has a housing 38, in which are arranged a coil pack 20 for the primary side, and a further coil pack 28 for the secondary side of the power transformer 10. The primary-side coil pack 20 is coupled electromagnetically via a core, in particular an annular core, to the secondary-side coil pack 28. In addition, the power transformer 10 has terminals 18 on the primary side, which form an electrical connection to the primary-side coil pack 20. Terminals 30 for the secondary side are similarly provided, which are electrically connected to the secondary-side coil pack 28. Each of the two coil packs 20, 28 has a multiplicity of windings. During operation of the power transformer 10, a voltage is dropped between the terminals 18 on the primary side, which voltage in turn results in a current through the terminals 18 and the windings of the primary-side coil pack 20. An electrical power is thereby consumed on the primary side. On the secondary side, a voltage is likewise dropped between the terminals 30, and a current flows through the terminals 30 and through the windings of the coil pack 28 on the secondary side. An electrical power is therefore provided on the secondary side. The power transformer 10 therefore serves to transfer and convert electrical power from the primary side to the secondary side. Heat is produced in the process, which can be absorbed by a coolant 40, which is preferably formed by an oil. The coolant 40 is likewise held in the interior of the housing 38, and can absorb and conduct to a cooler 26 the heat produced at the windings of the coil packs 20, 28. The cooler 26 is preferably an oil cooler for cooling the oil that preferably forms the coolant 40.

The coolant 40 is heated by a heat flow between the windings of the coil packs 20, 28 on the primary and secondary sides. Therefore, in particular at the primary-side windings, a particularly hot spot can arise in the coolant 40, where the coolant is particularly hot. A winding temperature sensor 22 is therefore preferably attached to or in a winding in order to determine the temperature at or in a winding. This temperature is also referred to as a hot-spot temperature. The winding temperature sensor 22 is preferably a temperature sensor designed to detect a temperature at or in a winding. As FIG. 1 shows schematically and by way of example, the winding temperature sensor 22 can be attached, for example, to a winding of the coil pack 20 on the primary side. The winding temperature sensor 22 can be connected to a detection unit 32 of the power transformer 10 via a signal connection. Further sensors of the power transformer 10 can preferably be coupled to this detection unit 32. As FIG. 1 shows by way of example, the power transformer 10 additionally and preferably has an oil temperature sensor 24. The oil temperature sensor 24 is arranged inside the housing 38 of the power transformer 10 and preferably in such a way that the oil temperature sensor 24 detects the temperature of the coolant 40 in a top region in the interior of the housing 38. Thus the oil temperature sensor 24 can be arranged, for example, so as to detect the top-oil temperature, as it is known. The oil temperature sensor 24 is coupled to the detection unit 32 via an associated signal connection. In addition, the power transformer 10 preferably has an ambient temperature sensor 14. The ambient temperature sensor 14 need not necessarily be attached to the housing 38 of the power transformer 10, although this is possible. It is preferred instead that the ambient temperature sensor 14 forms part of the power transformer 10 without being in thermal contact with the housing 38. The ambient temperature sensor 14 can thus be at least assigned to the power transformer 10 and be arranged close to the housing 38. The ambient temperature sensor 14 is coupled to the detection unit 32 via an associated signal connection. In addition, the power transformer 10 preferably has a current sensor 16 for detecting a current flowing through a terminal 18 of the power transformer 10. In FIG. 1, the current sensor 16 is arranged by way of example at one of the terminals 18 on the primary side in order to detect the current through the terminals 18. The current sensor 16 is coupled to the detection unit 32 via an associated signal connection. The ambient temperature sensor 14 and the current sensor 16 each detect physical quantities or properties that act on the power transformer 10 from the outside. The winding temperature sensor 22 and the oil temperature sensor 24 each detect physical quantities or properties prevailing inside the power transformer 10, in particular inside the housing 38 of the power transformer 10. It is therefore provided that, for example, the ambient temperature sensor 14 and the current sensor 16 produce first sensor data, and that the winding temperature sensor 22 and the oil temperature sensor 24 produce second sensor data. The sensor data from the sensors 14, 16, 22, 24 can be transferred to the detection unit via the respective signal connections. The detection unit 32 can be designed to produce a measurement signal that represents the first sensor data and the second sensor data. The detection unit 32 can send the measurement signal to a signal interface 4 of the device 2 via the signal connection 36. The device 2 is thereby provided with the first sensor data and the second sensor data, which represent in each case at least one quantity detected at or in the power transformer 10 by means of sensors.

Although power transformers 10 having a plurality of sensors are desirable, in practice often not all theoretically available and possible sensors are fitted. In particular, it can happen that a power transformer 10 does not have a winding temperature sensor 22. This is the case, for example, in FIG. 1 for the windings of the coil pack 28 on the secondary side 30. For the further explanation, it is assumed purely by way of example that the power transformer 10 shown in FIG. 1 does not have a winding temperature sensor 22, even though the temperature of the windings is of particular interest.

Based on the assumption that the previously described power transformer 10 does not have the winding temperature sensor 22, it can be stated that the second sensor data cannot represent the temperature of the windings. The second sensor data can be supplied, for example, solely by the oil temperature sensor 24. In other words, the second sensor data can represent, for example, the oil temperature of the coolant 40, in the form of oil, in a top, internal region of the housing 38. In order nonetheless to obtain information about the temperature at the windings, for example of the primary-side coil pack 20, the device 2, in simplified terms, is designed to determine what is known as a model value, which represents, for example, the temperature of a winding of the coil pack 20 on the primary side, even though the temperature is not detected by means of sensors.

The device 2 has a signal interface 4, a processor unit 6, and a memory unit 8. The memory unit 8 is preferably a memory unit for storing data. The processor unit 6 is designed to execute mathematical operations and/or signal processing. The processor unit 6 can comprise a microprocessor for this purpose. The signal interface 4 is designed to receive the measurement signal representing the first sensor data and the second sensor data. The signal interface 4 can receive this measurement signal from the detection unit 32 and via the signal connection 36. The signal interface 4 is coupled to the processor unit 6 preferably in such a way that the first sensor data and the second sensor data is provided for the processor unit 6. The signal interface 4 and the processor unit 6 can therefore be integrated.

The processor unit 6 is configured to produce in each of successive time windows in time a measurement dataset from the first and second sensor data received in the given time window. The length of a time window preferably equals 24 hours. In addition, it is preferred that a new time window with the associated measurement dataset is produced every four hours. The measurement datasets assigned to a time window can therefore comprise first and second sensor data that is the same in part. In addition, the time windows in the aforementioned example can each overlap by sixteen hours when two successive time windows are considered.

In the memory unit 8 is stored a mathematical simulation model of the power transformer 10. The processor unit 6 is configured to load and execute the simulation model. The simulation model is embodied such that the simulation model represents a transfer behavior of the power transformer 10. Since the simulation model is a mathematical model, input data can be processed by the simulation model during the execution, so that output data is created by the processing. The output data therefore depends on the input data. The transfer behavior of the simulation model can be changed, however, namely by associated model parameters. Thus the output data depends both on the model parameters of the simulation model and on the input data used in the execution of the simulation model. The processor unit 6 is designed to execute the simulation model using the input data and the associated model parameters for the simulation model, and thereby to produce output data. Model parameters, at least as initial parameters for executing the simulation model, can be stored in the memory unit 8 and/or can be loaded by the processor unit 6. The simulation model is also designed to produce during execution not only the output data but also a model value, specifically a model value for a temperature inside the power transformer 10 as a function of the input data and model parameters that are used in the execution. The model value can hence also be a result from the execution of the simulation model. The processor unit 6 is designed to execute the simulation model accordingly in order to determine the model value. For example, the simulation model can be embodied such that the model value represents the temperature at a winding of one of the coil packs 20, 28. Preferably, the simulation model is embodied such that the model value represents the temperature at a winding of the coil pack 20 on the primary side 20. Depending on the embodiment of the simulation model and preferably also based on the requirement of which temperature in the power transformer 10 is meant to be determined by means of the simulation model, the model value can also describe another temperature inside the power transformer 10. For instance, the model value can represent the top-oil temperature or a temperature of the coolant 40 in the cooler 26.

Figure 2:
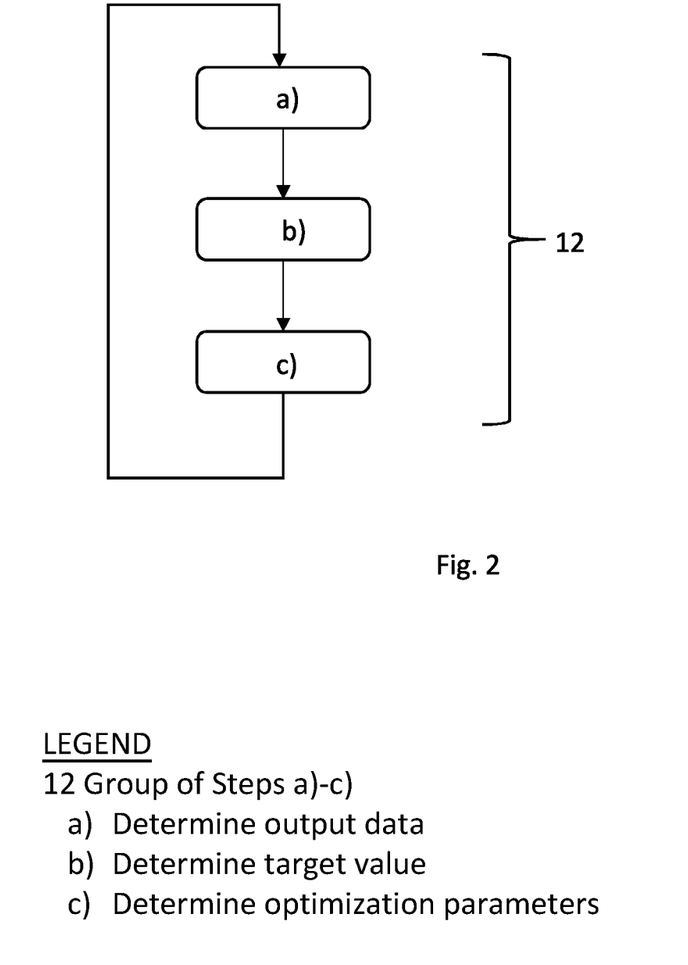
FIG. 2 shows a schematic diagram of a process flow according to an aspect of the present disclosure.

Since, however, the model value determined by the simulation model depends not only on the input data but also on the model parameters for the simulation model, it is desirable that the model parameters are chosen particularly advantageously so that the simulation model describes the transfer behavior of the power transformer 10 particularly precisely. It is therefore provided that a group 12 of steps a), b) and c), shown by way of example in FIG. 2, is executed repeatedly as a group in order to determine model parameters for the simulation model that allow particularly precise simulation of the power transformer 10 by the simulation model. In the repetition as a group, each group 12 of steps a) to c) is executed in full before the same group 12 of steps a) to c) is executed again and hence repeatedly. In the repetition as a group, the steps a) to c) of each group 12 are not executed in parallel but in succession. Nor does execution of steps from parallel groups 12 take place. Thus the groups 12 are executed in succession, and in each group 12, the steps a) to c) are executed in succession. This results in the repetition as a group.

The processor unit 6 is configured to determine in step a) output data by executing the simulation model using input data, which is defined by first sensor data from the measurement dataset assigned to the given time window, and using model parameters, which, for the first execution of the simulation model for the given time window are defined by predefined reference parameters, and otherwise by the most recently determined optimization parameters. The reference parameters can be initial parameters for the model parameters. It is thereby possible to execute the simulation model. The reference data can be stored in the memory unit 8 and/or can be loaded by the processor unit from the memory unit 8.

For the example shown in FIG. 1, the first sensor data is formed by the sensor data from the ambient temperature sensor 14 and from the current sensor 16. In this case, the first sensor data can therefore represent the ambient temperature of the power transformer 10 and the current on the primary side of the power transformer 10. Output data is produced by executing the simulation model using the first sensor data as the input data, and the reference parameters as the model parameters. The simulation model can be embodied in this case such that the output data represents quantities of the simulated power transformer 10 that correspond to the quantities detected by means of sensors from the second sensor data. In the example shown in FIG. 1 by way of example, output data that represents a simulated top-oil temperature for the coolant 40 in the interior of the housing 38 of the power transformer 10 can thus be produced by executing the simulation model.

According to step b), the processor unit 6 determines a target value, which comprises at least one squared error, weighted by a first weighting factor, which error is between the second sensor data from the measurement dataset assigned to the given time window and the output data previously determined in step a). With reference to the example shown in FIG. 1, the second sensor data represents the top-oil temperature detected by the oil temperature sensor 24. The output data determined in step a) represents a simulated top-oil temperature for the coolant 40 in the interior of the housing 38 of the power transformer 10. The error between the second sensor data and the output data can therefore be a positive error and a negative error, depending on the given sample value. The squared error stops the mathematical sign of the error being relevant. The first weighting factor can be chosen in such a way that the target value is calculated appropriately.

An example of a mathematical function for determining the target value is shown below:

$$E(p)=\int c_a(m(t,p)-s(t,p))^2 dt + \Sigma c_d(p_i-p_{i,pre})^2 + \Sigma c_r(p_i-p_{i,0})^2$$

The target value $E(p)$ depends on three components. The first component having the first integral symbol represents the squared error, weighted by the first weighting factor $c_a$, which error is between the second sensor data m and the output data s determined in step a). Each of the two further components of the target value starts with a summation symbol. The second component includes a second weighting factor $c_d$, and the third component includes a third weighting factor $c_r$.

It is preferred that the device 2 is configured to determine the target value E in step b), for the execution for the second target window onwards, in each case in such a way that the target value E additionally comprises a squared difference $(p_i-p_{i,pre})^2$, weighted by the second weighting factor $c_d$, which difference is between the most recently determined model parameters $p_i$ and the optimization parameters determined last for the preceding time window $p_{i,pre}$. By a choice of the second weighting factor $c_d$, the second component of the target value E can help to prevent a rapid change between the model parameters. This makes the simulation model robust to external disturbances.

It is also preferred that the device 2 is configured to determine the target value E in step b) in such a way that the target value E additionally comprises a squared difference $(p_i-p_{i,0})^2$, weighted by the third weighting factor $c_r$, which difference is between the most recently determined model parameters $p_i$ and the reference parameters $p_{i,0}$. By suitable choice of the third weighting factor $c_r$ in relation to the first and second weighting factors $c_a$ and $c_d$, the third component of the target value E can be chosen to be smaller in order to lend greater weight to the other components. A suitable choice of the third weighting factor $c_r$, however, can prevent too great a deviation occurring between the initial reference parameters $p_{i,0}$ and the current model parameters $p_i$. It is assumed here that the initial reference parameters $p_{i,0}$ allow at least approximately a sufficiently good simulation of the transfer behavior of the power transformer 10 by the simulation model.

In addition, the processor unit 6 is configured to determine in step c) optimization parameters as new model parameters for the simulation model on the basis of the at least one target value from step b) determined in the given time window. For instance, the processor unit 6 can be configured to execute an optimization method in order to determine the optimization parameters. For said optimization method, recourse is made to the target value determined in preceding steps b) and to the optimization parameters determined in the previous steps c), in order to determine, for the determination of the optimization parameters currently being performed on the basis of the optimization method, new optimization parameters as model parameters for the simulation model that bring about a lower target value in the next step b). Thus the optimization method can be embodied so as to minimize and/or keep as small as possible in step c) the target value. This is reasonable because the target value comprises squared errors or squared differences in a weighted manner, which should be kept as small as possible. Optimization methods are known fundamentally from the prior art and can be applied in the execution of the group 12 of steps a) to c). Preferably, the processor unit 6 is configured to repeat the group 12 of steps a) to c) between 10 and 1000 times. It has been found in practice that thereby, when step c) is executed for the last time, optimization parameters can be determined as new model parameters that allow a particularly advantageous simulation of the transfer behavior of the power transformer 10. In addition, the simulation model can use said model parameters to determine a model value for the temperature inside the power transformer 10, which is preferably not detected by means of sensors. The processor unit 6 is therefore configured to determine for each time window the model value by executing the simulation model using input data, which is defined by first sensor data from the measurement dataset assigned to the given time window, and using model parameters, which for the given time window are defined by the most recently determined optimization parameters. It is thereby possible to determine for each time window a particularly precise model value, which hence also describes or represents the temperature inside the power transformer 10 particularly precisely. This temperature can be, for example, the temperature at one of the windings of one of the coil packs 20, 28. The device 2 advantageously has a further interface 34, which is coupled to the processor unit 6. In addition, the device 2 can be designed so as to transfer by means of the further interface 34 an output signal representing the model value, in particular the most recently determined model value.

Figure 3:
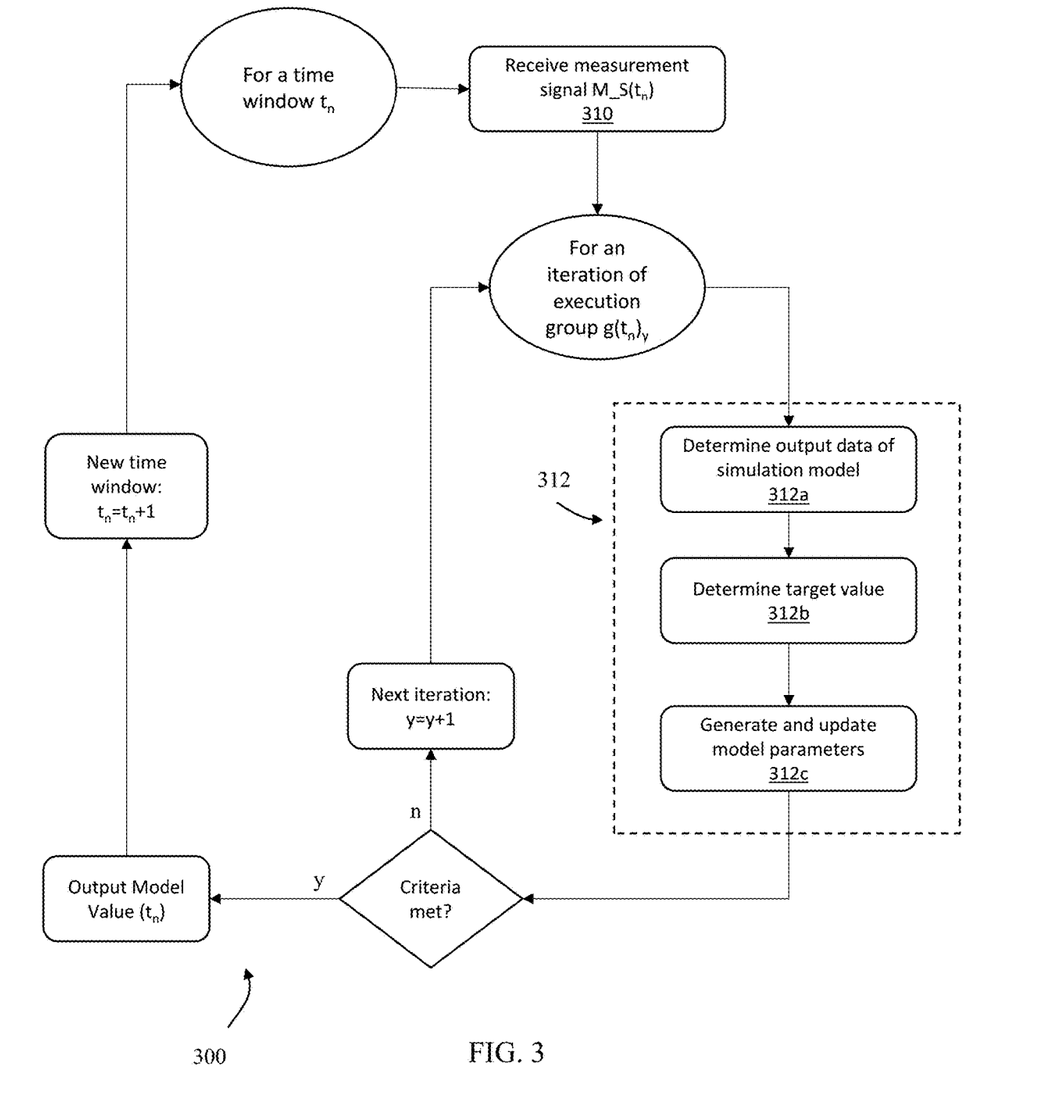
FIG. 3 shows a schematic diagram of another process flow according to an aspect of the present disclosure.

FIG. 3 shows a schematic diagram of a process flow 300 according to an aspect of the present disclosure. A processor unit may be configured to execute the process flow 300.

The process flow 300 is organized based on execution of a given time window $t_n$ of a plurality of time windows $t_0$, $t_1, \ldots t_n, t_{n+1}$. Where, for a given time window $t_n$, a signal interface may receive 310 a measurement signal $M\_S(t_n)$ representing first sensor data $S1(t_n)$ and second sensor data $S2(t_n)$. The first sensor data and second sensor data, in each case, represent at least one quantity detected in or at a power transformer by means of sensors. The processor unit is configured to produce in each of successive time windows a measurement dataset $M\_D(t_n)$ from the first and second sensor data received in the given time window. In the memory unit is stored a simulation model of the power transformer. This simulation model describes a transfer behavior for input data into output data as a function of model parameters Param( ) of the simulation model.

For each time window $t_n$, the process flow 300 includes the repeated execution of group of steps 312, which are executed, in succession. That is, for each execution group $g(t_n)_y$, the process flow executes, in succession: 312a) determining output data $O\_D(g(t_n)_y)$ by executing the simulation model using input data, which is defined by first sensor data $S1(t_n)$ from the measurement dataset $M\_D(t_n)$ assigned to the given time window $t_n$, and using model parameters $M\_P(g(t_n)_y)$ which, for the first execution of the simulation model for the given time window are defined by predefined reference parameters, and otherwise by the most recently determined optimization parameters; 312b) determining a target value $T\_V(t_n)$, which comprises at least one squared error, weighted by a first weighting factor $W1(g(t_n)_y)$, which error is between the second sensor data $S2(t_n)$ from the measurement dataset $M\_D(t_n)$ assigned to the given time window $t_n$ and the previously determined output data $O\_D(g(t_n)_{y-1})$; and 312c) determining optimization parameters $O\_Param(g(t_n)_{y+1})$ for the simulation model on the basis of the at least one target value $T\_V(t_n)$ determined in the given time window $t_n$.

The simulation model is then updated using the determined optimization parameters $O\_Param(g(t_n)_{y+1})$ as new model parameters $Param(g(t_n)_{y+1})$ for the simulation model. An inner loop of the process flow 300 then continues for the same time window $t_n$, by executing a next iteration of the execution group $g(t_n)_{y+1}$ This loop will repeat for the same time window $t_n$, until a predetermined criteria is met.

Once the predetermined criteria is met, the repeated execution of the group of steps 312 ends for the given time window $t_n$. At this point, the simulation model describes a model value for a temperature inside the power transformer as a function of input data for the given time window and model parameters defined by the most recently determined optimization parameters of that given time window.

The process flow 300 will subsequently execute the outer loop for the next time window $t_{n+1}$.

In addition, it should be pointed out that "having" does not exclude any other elements or steps and "a" or "an" does not exclude a plurality. Furthermore, it should be pointed out that features that have been described with reference to one of the above exemplary embodiments can also be used in combination with other features of other exemplary embodiments described above. Reference signs in the claims should not be construed as a limitation.

While subject matter of the present disclosure has been illustrated and described in detail in the drawings and foregoing description, such illustration and description are to be considered illustrative or exemplary and not restrictive. Any statement made herein characterizing the invention is also to be considered illustrative or exemplary and not restrictive as the invention is defined by the claims. It will be understood that changes and modifications may be made, by those of ordinary skill in the art, within the scope of the following claims, which may include any combination of features from different embodiments described above.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

LIST OF REFERENCE SIGNS 1 system
2 device
4 signal interface
6 processor unit
8 memory unit
10 power transformer
12 group
14 ambient temperature sensor
16 current sensor
18 primary-side terminals
20 primary-side coil pack
22 winding temperature sensor
24 oil temperature sensor
26 cooler
28 secondary-side coil pack
30 secondary-side terminals
32 detection unit
34 further signal interface
36 signal connection
38 housing
40 coolant

The invention claimed is:

1. A device, the device comprising:
a signal interface;
a processor unit; and
a memory unit;
wherein the signal interface is designed to receive a measurement signal representing first sensor data and second sensor data,
wherein the first sensor data and the second sensor data, in each case, represent at least one quantity detected in or at a power transformer by sensors,
wherein the processor unit is configured to produce, in each of successive and separate time windows, a respective measurement dataset from the first sensor data and the second sensor data received in a given time window,
wherein, in the memory unit, a simulation model of the power transformer is stored, the simulation model describing a transfer behavior for input data into output data as a function of model parameters of the simulation model,
wherein the processor unit is configured to execute the following group of steps a) to c) in an on-line mode of the power transformer with voltage being applied to a primary side of the power transformer and a current flowing through the primary side the power transformer, the following group of steps a) to c) are executed in succession in a respective loop that repeats during the given time window of the time windows, and a new loop executes in each of the time windows, the group of steps a) to c) comprises:
a) determining the output data by executing the simulation model using the input data, which is defined by the first sensor data from the respective measurement dataset assigned to the given time window, and using the model parameters, which, for a first execution of the simulation model for the given time window, are defined by predefined reference parameters, and otherwise by most recently determined optimization parameters,
b) determining a target value, which comprises at least one squared error, weighted by a first weighting factor, the squared error is between the second sensor data from the measurement dataset assigned to the given time window and a previously determined output data, and
c) determining optimization parameters as new model parameters for the simulation model on the basis of the at least one target value determined in the given time window,
wherein the simulation model also describes a model value for a temperature inside the power transformer as a function of the input data and the model parameters, and
wherein the processor unit is configured to determine, individually for each time window, the model value by executing the simulation model using the input data, which is defined by the first sensor data from the respective measurement dataset assigned to the given time window, and using the model parameters, which for the given time window, are defined by the most recently determined optimization parameters,
wherein the first sensor data represents quantities acting on the power transformer from the outside and detected by first sensors of the sensors,
wherein the first sensors comprise at least one of: a current sensor, a voltage sensor, a temperature sensor, a solar radiation sensor, a wind speed sensor,
wherein the second sensor data represents quantities detected inside the power transformer by second sensors of the sensors, and
wherein the second sensors comprise at least one of: a temperature sensor or a viscosity sensor.

2. The device as claimed in claim 1, wherein the temperature of the power transformer, the temperature being described by the model value, comprises, or is, a hot-spot temperature or a top-oil temperature or a bottom-oil temperature of the power transformer.

3. The device as claimed in claim 1, wherein in the respective loop for the respective one of the time windows, a number of repetitions as a group of the group of steps a) to c) is between 10 and 1000.

4. The device as claimed in claim 1, wherein the device is configured to determine the target value in step b), for the execution for the second time window onwards, in each case, in such a way that the target value additionally comprises a squared difference, weighted by a second weighting factor, which difference is between the most recently determined model parameters and the optimization parameters determined last for the preceding time window.

5. The device as claimed in claim 1, wherein the device is configured to determine the target value in step b) in such a way that the target value additionally comprises a second squared difference, weighted by a third weighting factor, which difference is between the most recently defined model parameters and reference parameters.

6. The device as claimed in claim 1, wherein the first sensor data represents at least two quantities selected from the following group of quantities: electric current on the primary side of the power transformer, electric current on a secondary side of the power transformer, electrical power on the primary side of the power transformer, electrical power on the secondary side of the power transformer, ambient temperature outside the power transformer, solar radiation power outside the power transformer, and wind speed outside the power transformer.

7. The device as claimed in claim 1, wherein the second sensor data represents at least one quantity selected from the following group of quantities: oil temperature, oil temperature at a top of the power transformer, oil temperature at a bottom of the power transformer, winding temperature at primary-side windings, winding temperature at secondary-side windings, heat flow from the primary-side windings of the power transformer into oil of the power transformer, heat flow from the secondary-side windings of the power transformer into the oil of the power transformer, and oil viscosity of the oil of the power transformer.

8. The device as claimed in claim 1, wherein the first sensor data and the second sensor data from the measurement dataset represent, in each case, the associated quantities resulting from sample values of the quantities detected at periodic intervals by the sensors.

9. The device as claimed in claim 1, wherein the device is configured so that in each time window, an associated measurement dataset is produced from the first sensor data and the second sensor data that represent the associated quantities over a predefined time span.

10. The device as claimed in claim 9, wherein the predefined time span is greater than a largest time constant of the power transformer.

11. The device as claimed in claim 9, wherein the predefined time span equals at least two hours, at least four hours, at least eight hours, at least sixteen hours, at least twenty-four hours, or at least two days.

12. The device as claimed in claim 1, wherein the simulation model is based on an IEEE Annex G model for the power transformer.

13. The device as claimed in claim 1, wherein the simulation model is based on an IEC model for the power transformer.

14. The device as claimed in claim 1, wherein the device is designed to transfer, by the signal interface or another interface, an output signal representing the model value.

15. The device as claimed in claim 1, wherein the processor unit is configured to define the optimization parameters most recently determined for a time window as final parameters for the given time window, to determine trend parameters by an approximation using the plurality of final parameters, to compare the trend parameters with associated predefined limit values, and, in the event that one of the limit values is exceeded, to define a first warning state for the power transformer.

16. A system, the system comprising:
a plurality of devices, each designed according to the device as claimed in claim 1,
wherein the system is designed to compare with each other the model parameters defined by each of the devices, and thereby ascertain model-parameter differences in each case, and
wherein the system is designed to compare each of the model-parameter differences with associated predefined limit values, and in the event that one of the limit values is exceeded, to identify the model parameters causing the exceeding, and the associated power transformer, and to define for the identified power transformer a second warning state.

17. The system of claim 16, wherein the system is configured to initiate a repair of the identified power transformer based on the second warning state being defined.

18. The device as claimed in claim 1, wherein the device is configured to transfer the output signal to a controller, and wherein the controller is configured to control the power transformer based on the output signal.

* * * * *